(12) United States Patent
Nakazawa

(10) Patent No.: US 12,199,022 B2
(45) Date of Patent: Jan. 14, 2025

(54) SEMICONDUCTOR MODULE

(71) Applicant: FUJI ELECTRIC CO., LTD., Kawasaki (JP)

(72) Inventor: Masayoshi Nakazawa, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 177 days.

(21) Appl. No.: 18/159,644

(22) Filed: Jan. 25, 2023

(65) Prior Publication Data

US 2023/0163056 A1    May 25, 2023

Related U.S. Application Data

(63) Continuation of application No. PCT/JP2021/047320, filed on Dec. 21, 2021.

(30) Foreign Application Priority Data

Feb. 12, 2021 (JP) .................................. 2021-020737

(51) Int. Cl.
*H01L 23/498* (2006.01)
*H01L 23/538* (2006.01)
(Continued)

(52) U.S. Cl.
CPC .... *H01L 23/49811* (2013.01); *H01L 23/5386* (2013.01); *H01L 25/072* (2013.01);
(Continued)

(58) Field of Classification Search
CPC ........... H01L 23/49811; H01L 23/5386; H01L 25/072; H02H 7/1206
See application file for complete search history.

(56) References Cited

U.S. PATENT DOCUMENTS 5,616,955 A    4/1997 Yamada
5,761,040 A *  6/1998 Iwasa ..................... H01L 24/49
                                          257/E23.068
(Continued)

FOREIGN PATENT DOCUMENTS

EP    3432460 A1    1/2019
JP    H0799275 A    4/1995
(Continued)

OTHER PUBLICATIONS

International Search Report and (ISA/237) Written Opinion of the International Search Authority for International Patent Application No. PCT/JP2021/047320, mailed by the Japan Patent Office on Feb. 22, 2022.

*Primary Examiner* — Scott Bauer

(57) ABSTRACT

A semiconductor module, including: plurality of output elements provided to constitute an upper arm and a lower arm; a resin case provided surrounding an accommodation space for accommodating the output elements; an arm-to-arm wiring line for connecting the upper arm with the lower arm; an output terminal, which is connected to the arm-to-arm wiring line and is for outputting output currents from the output elements to a load being external to the semiconductor module; a sense terminal, which is connected to the arm-to-arm wiring line and is for detecting currents that flow in the output elements; and an inductor provided between a connection point for connecting the arm-to-arm wiring line with the output terminal, and the output terminal is provided. An inductance of the inductor is 1 μH or more.

20 Claims, 15 Drawing Sheets

(51) Int. Cl.
  *H01L 25/07* (2006.01)
  *H02H 7/12* (2006.01)
  *H01L 23/00* (2006.01)
  *H01L 23/053* (2006.01)
  *H01L 23/29* (2006.01)

(52) U.S. Cl.
  CPC ......... *H02H 7/1206* (2013.01); *H01L 23/053* (2013.01); *H01L 23/296* (2013.01); *H01L 24/48* (2013.01); *H01L 24/49* (2013.01); *H01L 2224/48139* (2013.01); *H01L 2224/48227* (2013.01); *H01L 2224/49111* (2013.01); *H01L 2224/49175* (2013.01); *H01L 2924/10272* (2013.01); *H01L 2924/13091* (2013.01)

(56) References Cited

U.S. PATENT DOCUMENTS

| | | | |
|---|---|---|---|
| 5,967,858 A | 10/1999 | Yamada | |
| 10,050,025 B2* | 8/2018 | Noquil | H01L 23/49838 |
| 2012/0194148 A1* | 8/2012 | Yiu | H01L 23/645 |
| | | | 438/106 |
| 2012/0313595 A1* | 12/2012 | Mao | H02M 3/158 |
| | | | 29/832 |
| 2013/0293211 A1* | 11/2013 | Chen | H02M 3/1588 |
| | | | 323/282 |
| 2015/0162297 A1* | 6/2015 | Cho | H02M 3/155 |
| | | | 257/76 |
| 2017/0005570 A1 | 1/2017 | Nakashima | |
| 2019/0267331 A1 | 8/2019 | Hatanaka | |
| 2020/0169174 A1* | 5/2020 | Wachi | H02M 1/088 |
| 2020/0350255 A1* | 11/2020 | Parto | H02M 3/1584 |
| 2021/0119542 A1* | 4/2021 | Clavette | G06F 1/26 |

FOREIGN PATENT DOCUMENTS

| | | |
|---|---|---|
| JP | H10173126 A | 6/1998 |
| JP | 2008017620 A | 1/2008 |
| JP | 2015023086 A | 2/2015 |
| JP | 5683525 B2 | 3/2015 |
| WO | 2015121931 A1 | 8/2015 |
| WO | 2017090267 A1 | 6/2017 |
| WO | 2017158867 A1 | 9/2017 |

* cited by examiner

SEMICONDUCTOR MODULE

The contents of the following Japanese patent application (s) are incorporated herein by reference:
NO. 2021-020737 filed in JP on Feb. 12, 2021
NO. PCT/JP2021/047320 filed in WO on Dec. 21, 2021

BACKGROUND

1. Technical Field

The present invention relates to a semiconductor module.

2. Related Art

Conventionally, a semiconductor module on which an output element such as an IGBT (Insulated Gate Bipolar Transistor) or a SiCMOSFET is mounted has been known (refer to Patent Documents 1 and 2, for example).
Patent Document 1: Japanese Patent Application Publication No. H7-99275
Patent Document 2: Japanese Patent Application Publication No. H10-173126

DESCRIPTION OF EXEMPLARY EMBODIMENTS

Figure 1:
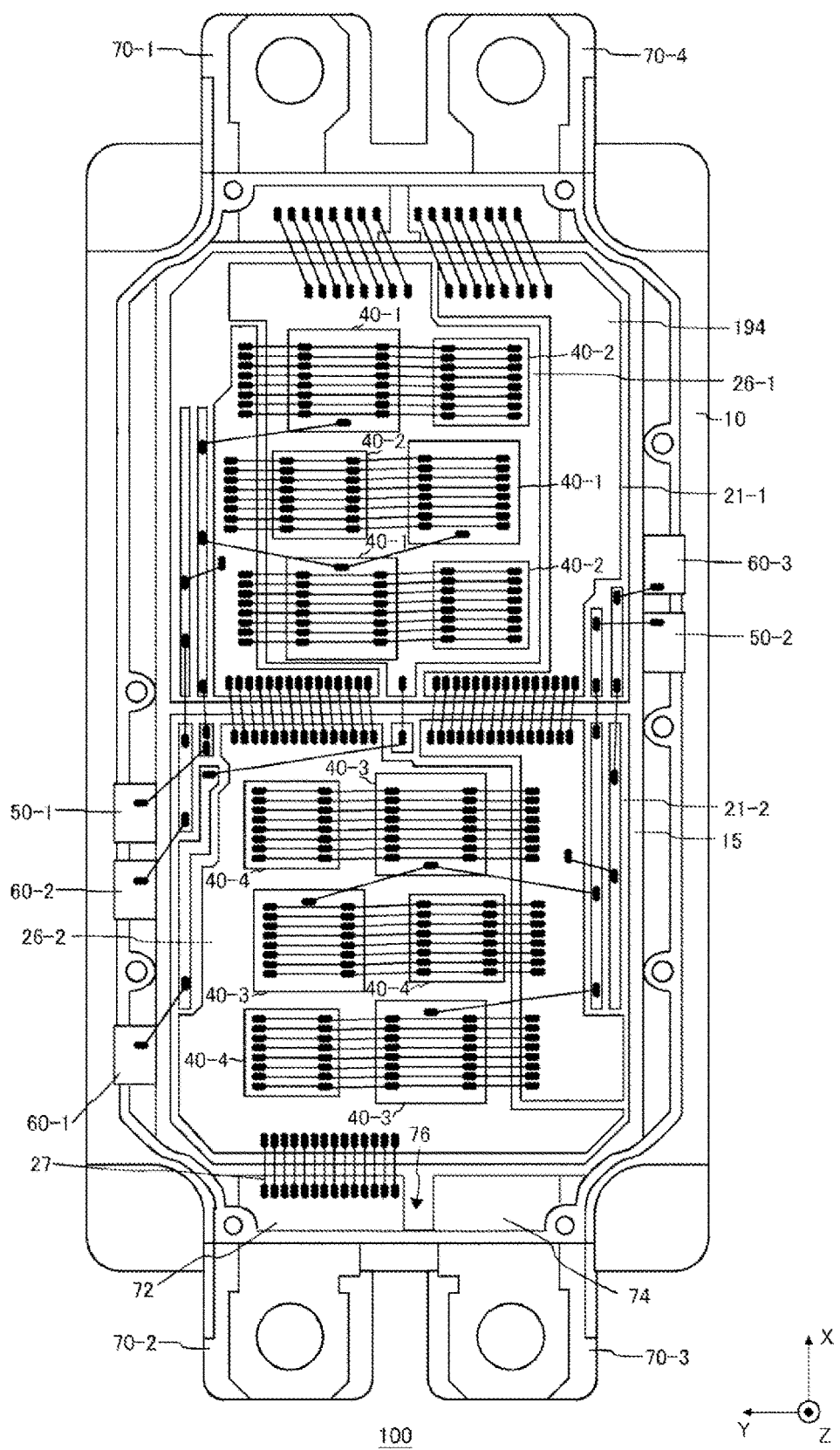
FIG. 1 illustrates one example of a semiconductor module 100 according to one embodiment of the present invention.

Hereinafter, the invention will be described through embodiments of the invention, but the following embodiments do not limit the present invention according to claims. In addition, not all of the combinations of features described in the embodiments are essential for a solving means of the invention. Note that, in the present specification and the drawings, elements having substantially the same functions and configurations are denoted by the same reference numerals, and redundant descriptions for them are omitted. Also, elements not directly related to the present invention are omitted from the drawings. In one drawing, elements having the same function and configuration are representatively denoted by a reference numeral, and the reference numerals for others may be omitted.

As used herein, one of directions parallel to a depth direction of an output element is referred to as "upper", and the other is referred to as "lower". One of two main surfaces of a substrate, a layer or other member is referred to as an "upper surface", and the other surface is referred to as a "lower surface". The "upper" and "lower" directions are not limited to a gravity direction or a direction at a time of mounting a semiconductor module.

As used herein, technical matters may be described with orthogonal coordinate axes consisting of an X axis, a Y axis, and a Z axis. The orthogonal coordinate axes are merely for specifying relative positions of components, and thus not for limiting to a specific direction. For example, the Z axis is not limited to indicate a height direction with respect to the ground. A+Z axis direction and a −Z axis direction are directions opposite to each other. When a direction is referred to as a "Z axis direction" without these "+" and "−" signs, it means the Z axis direction is parallel to +Z and −Z axes. As used herein, the X and Y axes are orthogonal axes parallel to an upper surface and a lower surface of the output element. Also, the Z axis is an axis perpendicular to the upper surface and the lower surface of the output element. As used herein, a direction of the Z axis may be referred to as a depth direction. In addition, as used herein, a direction parallel to the upper surface and the lower surface of the output element, which includes the X and Y axes, may be referred to as a horizontal direction.

As used herein, phrases such as "same" or "equal" may be used even when there is an error caused due to a variation in a manufacturing step or the like. This error is within a range of 10% or less, for example.

FIG. 1 illustrates one example of a semiconductor module 100 according to one embodiment of the present invention. The semiconductor module 100 may function as a power conversion device such as an inverter or a converter. An electronic circuit including an output element 40 and the like is accommodated inside the semiconductor module 100. The semiconductor module 100 of the present example includes a resin case 10, a base plate 15, and an insulating substrate 21.

The electronic circuit including the output element 40 and the like is accommodated inside the resin case 10. In the present example, the resin case 10 is provided surrounding an accommodation space 194 for accommodating a plurality of output elements 40. By way of example, the resin case 10 is connected to the base plate 15 on which the insulating substrate 21 is arranged. Note that, even though it is omitted from illustration of FIG. 1, a corner of the resin case 10 may have a through hole such as a screw hole for fixing the semiconductor module 100 to an outside. The resin case 10 may have a side wall provided so as to surround the accommodation space 194.

The resin case 10 is provided with a plurality of main terminals 70. In the present example, the resin case 10 is provided with a main terminal 70-1, a main terminal 70-2, a main terminal 70-3, and a main terminal 70-4. The plurality of main terminals 70 are electrically connected to an electronic circuit arranged on the insulating substrate 21.

The main terminals 70 are formed of conductive materials. For example, each main terminal 70 serves as a current path for a large current that flows into a power device such as a SiCMOSFET. The main terminal 70 of the present example has a plate shape.

The main terminals 70-2 and 70-3 are examples of output terminals. The main terminals 70-2 and 70-3 are connected to a load being external to the module, and configured to output an output current from the output element 40 to the load being external to the module.

The resin case 10 is provided with a gate terminal 50 and a sense terminal 60. In the present example, the resin case 10 is provided with a gate terminal 50-1, a gate terminal 50-2, a sense terminal 60-1, a sense terminal 60-2, and a sense terminal 60-3. The gate terminal 50 and the sense terminal 60 may have areas smaller than an area of the main terminal 70 as seen in a top view. The gate terminal 50 and the sense terminal 60 are electrically connected to an electronic circuit arranged on the insulating substrate 21. By applying the gate terminal 50 with a gate voltage, the gate voltage is applied to a gate pad of each output element 40. Therefore, by controlling the gate voltage, each output element 40 can be controlled. Further, a sense current can be measured by the sense terminal 60. That is, the sense terminal 60 is configured to detect a current that flows in the output element. The gate terminal 50 and the sense terminal 60 are connected to a circuit pattern 26 through a wire 27.

In the present example, the resin case 10 and the base plate 15 are molded with resin such as thermosetting resin with which they can be formed through injection molding, or ultraviolet curing resin with which they can be formed through UV molding. The resin may contain one or more polymer materials selected from a polyphenylene sulfide (PPS) resin, a polybutylene terephthalate (PBT) resin, a polyamide (PA) resin, an acrylonitrile butadiene styrene (ABS) resin, an acrylic resin and the like.

One or more insulating substrates 21 are arranged on the base plate 15. In the present example, an insulating substrate 21-1 and an insulating substrate 21-2 are arranged alongside each other in an X axis direction on the base plate 15. At least one output element 40 is arranged on the insulating substrate 21. In the present example, three output elements 40-1 and three output elements 40-2 are arranged on the insulating substrate 21-1, and three output elements 40-3 and three output elements 40-4 are arranged on the insulating substrate 21-2. In the present example, the output elements 40-1 and 40-2 are arranged on an upper surface of a circuit pattern 26-1 on the insulating substrate 21-1. The output elements 40-3 and 40-4 are arranged on an upper surface of a circuit pattern 26-2 on the insulating substrate 21-2.

In the present example, the output elements 40-1 and 40-3 are SiCMOSFETs, and the output elements 40-2 and 40-4 are FWDs (Free Wheel Diodes). The output elements 40-1 and 40-3 can be IGBTs. An RC (Reverse Conducting)-IGBT being a combination of an IGBT, a FWD, and the like can be arranged on the insulating substrate 21. A main electrode and a gate pad are provided on front surfaces of the output elements 40-1 and 40-3. By way of example, the main electrode is a source electrode. Back-surface electrodes are provided on back surfaces of the output elements 40-1 and 40-3. By way of example, the back-surface electrodes are drain electrodes. If the output elements 40-1 and 40-3 are the IGBTs, the source electrode may be read as being an emitter electrode, and a drain electrode may be read as being a collector electrode. Anode electrodes are provided on front surfaces of the output elements 40-2 and 40-4. Cathode electrodes are provided on back surfaces of the output elements 40-2 and 40-4. The output elements 40-1 and 40-2 may constitute an upper arm of the semiconductor module 100. The output elements 40-3 and 40-4 may constitute a lower arm of the semiconductor module 100.

The circuit pattern 26 is arranged on an upper surface of the insulating substrate 21. The circuit pattern 26 is a wiring pattern provided on the insulating substrate 21. The circuit pattern 26 may be formed by directly bonding a copper plate or an aluminum plate, or a plated plate of these materials, or bonding the same through a brazing layer, to the insulating substrate 21 consisting of aluminum oxide ceramics, silicon nitride ceramics, aluminum nitride ceramics, or the like. The insulating substrate 21 may be consisting of ceramics added with zirconium oxide, yttrium oxide, or the like. The circuit pattern 26 may be consisting of an alloy containing at least any one of copper or aluminum. The insulating substrate 21 and the circuit pattern 26 may be formed by sticking an insulation sheet on a conductive member such as a copper plate or an aluminum plate. In other words, the insulating substrate 21 and the circuit pattern 26 may be a plate member made of conductive member and an insulating member formed integrally. The each output element 40 and each circuit pattern 26 are connected through the wire 27.

Figure 5:
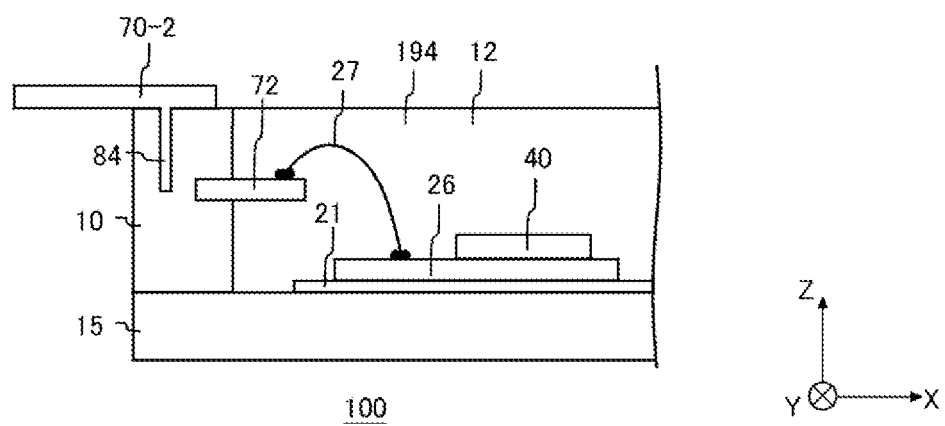
FIG. 5 illustrates one example of a schematic view of a connecting portion 72 of the semiconductor module 100.
Figure 6:
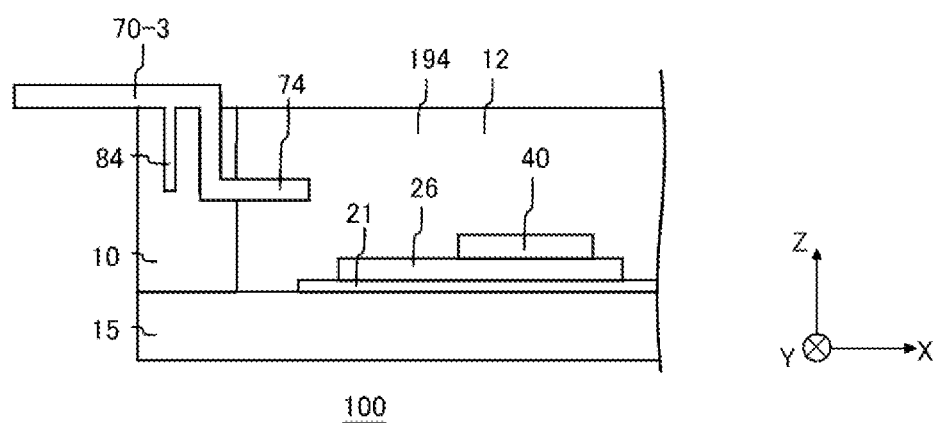
FIG. 6 illustrates one example of a schematic view of a connecting portion 74 of the semiconductor module 100.

In the present example, an encapsulation resin 12 is provided inside the resin case 10, as illustrated in FIGS. 5 and 6. The encapsulation resin 12 is configured to encapsulate the output element 40, the circuit pattern 26, and the wire 27. In other words, the encapsulation resin 12 is for covering an entire output element 40, an entire circuit pattern 26 and an entire wire 27 so that the output element 40, the circuit pattern 26, and the wire 27 are not to be exposed. By virtue of the encapsulation resin 12, the output element 40, the circuit pattern 26, and the wire 27 can be protected. By way of example, the encapsulation resin 12 is a silicon gel.

The resin case 10 is provided with a connecting portion 72 and a connecting portion 74. The connecting portions 72 and 74 are provided in the resin case 10 and the accommodation space 194. In the present example, at least a part of the connecting portions 72 and 74 is provided in the resin case 10. Further, at least a part of the connecting portions 72 and 74 is provided in the accommodation space 194. In the present example, there is a gap 76 between the connecting portion 72 and the connecting portion 74, so that the connecting portions 72 and 74 are not directly connected. The connecting portion 72 is connected to the circuit pattern 26 through the wire 27. The connecting portions 72 and 74 are electrically connected to the main terminals 70-2 and 70-3. The connecting portion 74 is directly connected to the main terminals 70-2 and 70-3. The connecting portions 72 and 74 are connected via an inductor 84 (refer to FIG. 2). Therefore, the connecting portion 72 is connected to the main terminals 70-2 and 70-3 via the inductor 84 or the connecting portion 74.

Figure 2:
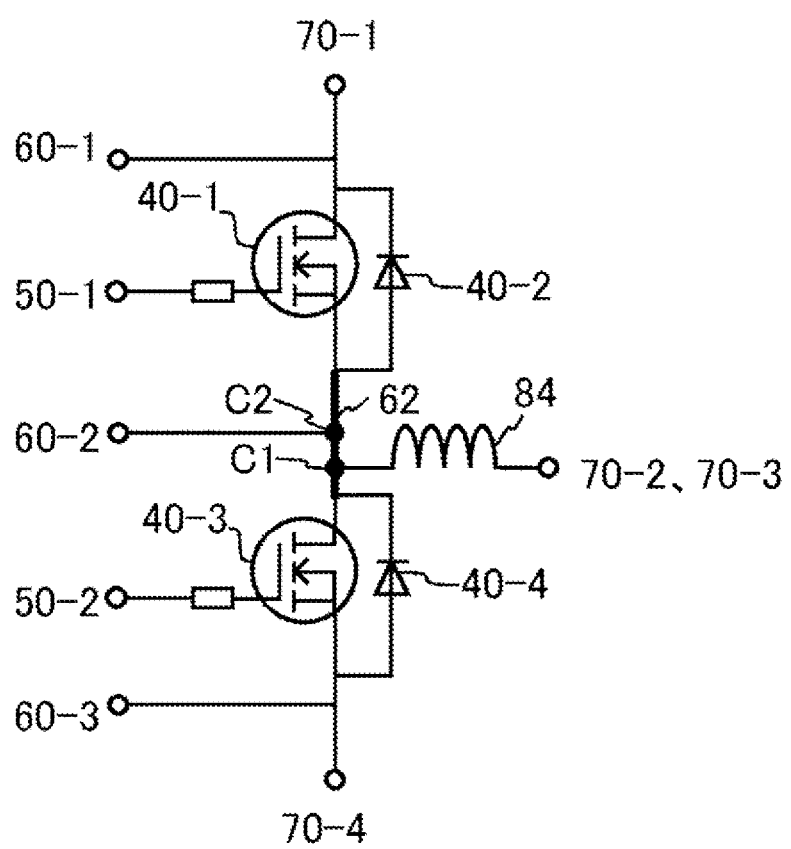
FIG. 2 illustrates one example of circuitry of an output element 40 of the semiconductor module 100.

FIG. 2 illustrates one example of circuitry of the output element 40 of the semiconductor module 100. In the present example, only one output element is illustrated for each of the output elements 40-1, 40-2, 40-3, and 40-4, whereas the each of the output elements 40 can have three output elements connected in parallel. The drain electrode of the output element 40-1 and the cathode electrode of the output element 40-2 are connected to the main terminal 70-1. The source electrode of the output element 40-3 and the anode electrode of the output element 40-4 are connected to the main terminal 70-4. The gate pad of the output element 40-1 is connected to the gate terminal 50-1. The gate pad of the output element 40-3 is connected to the gate terminal 50-2.

The upper arm composed of the output elements 40-1 and 40-2, and the lower arm composed of the output elements 40-3 and 40-4 are connected through an arm-to-arm wiring line 62. In FIG. 2, the arm-to-arm wiring line 62 is shown with a bold line. More specifically, the source electrode of the output element 40-1 and the anode electrode of the output element 40-2, and the drain electrode of the output element 40-3 and the cathode electrode of the output element 40-4 are connected through the arm-to-arm wiring line 62. The arm-to-arm wiring line 62 is connected to the main terminals 70-2 and 70-3 via a connection point C1. The arm-to-arm wiring line 62 is connected to the sense terminal 60-2 via a connection point C2. That is, the connection points C1 and C2 are provided on the arm-to-arm wiring line 62.

The inductor 84 is provided between the connection point C1 for connecting the arm-to-arm wiring line 62 with the main terminal 70 (the main terminals 70-2 and 70-3 in the present example), and the main terminal 70. In other words, the inductor 84 is provided between the source electrode of the output element 40-1 and the anode electrode of the output element 40-2, and the main terminal 70. The inductor 84 is provided between the drain electrode of the output element 40-3 and the cathode electrode of the output element 40-4, and the main terminal 70. Other than the inductor 84, wiring inductances generated by the wire 27 and the circuit pattern 26 on the insulating substrate 21 may be provided between the source electrode of the output element 40-1 and the anode electrode of the output element 40-2, and the main terminal 70. Other than the inductor 84, wiring inductances generated by the wire 27 and the circuit pattern 26 on the insulating substrate 21 may be provided between the drain electrode of the output element 40-3 and cathode electrode of the output element 40-4, and the main terminal 70. A wiring inductance may also be provided between the connection point C1 for connecting the arm-to-arm wiring line 62 and the main terminal 70, and the main terminal 70. Overall, the wiring inductances and the inductance generated by the inductor 84 are provided between the connection point C1 for connecting the arm-to-arm wiring line 62 with the main terminal 70, and the main terminal 70.

The inductor 84 is not provided between the connection point C2 for connecting the arm-to-arm wiring line 62 with the sense terminal 60-2, and the sense terminal 60-2. That is, the inductor 84 is not provided between the source electrode of the output element 40-1 and the anode electrode of the output element 40-2, and the sense terminal 60-2. The inductor 84 is not provided between the drain electrode of the output element 40-3 and the cathode electrode of the output element 40-4, and the sense terminal 60-2. Wiring inductances generated by the wire 27 and the circuit pattern 26 on the insulating substrate 21 may be provided between the source electrode of the output element 40-1 and the anode electrode of the output element 40-2, and the sense terminal 60-2. Wiring inductances generated by the wire 27 and the circuit pattern 26 on the insulating substrate 21 may be provided between the drain electrode of the output element 40-3 and the cathode electrode of the output element 40-4, and the sense terminal 60-2. A wiring inductance may also be provided between the connection point C2 for connecting the arm-to-arm wiring line 62 with the sense terminal 60-2, and the sense terminal 60-2. Overall, the wiring inductances are provided between the connection point C2 for connecting the arm-to-arm wiring line 62 with the sense terminal 60-2, and the sense terminal 60-2, but an inductance generated by the inductor 84 is not provided between them.

Note that, the wiring inductances generated by the wire 27 and the circuit pattern 26 are significantly less than the inductance generated by the inductor 84. Preferably, the wiring inductances generated by the wire 27 and the circuit pattern 26 are one-tenth of the inductance generated by the inductor 84, or less. More preferably, the wiring inductances generated by the wire 27 and the circuit pattern 26 are one-twentieth of the inductance generated by the inductor 84, or less. With such a configuration, loss that is caused due to inner wiring lines can be reduced and a destructive failure in the output element 40 can be prevented at a same time.

The connection point C1 and the connection point C2 are separately shown in FIG. 2, whereas the connection points C1 and C2 can be one point. When the connection points C1 and C2 are conducted with each other with very low impedance, the connection points C1 and C2 can be one point.

Figure 3:
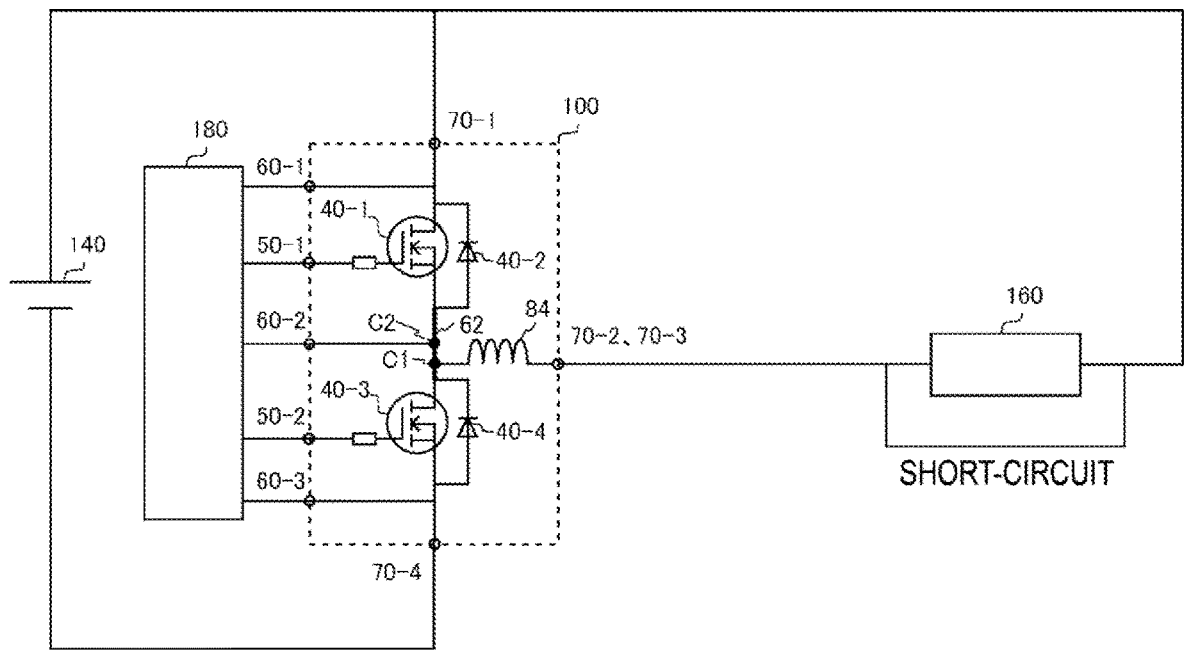
FIG. 3 illustrates one example of connection of the output element 40 of the semiconductor module 100 to an outside.

FIG. 3 illustrates one example of connection of the output element 40 of the semiconductor module 100 to an outside. In the present example, the semiconductor module 100 is externally connected to a power supply 140, a load 160, and a controller 180.

The power supply 140 is configured to supply the semiconductor module 100 with power. The power supply 140 is connected to the main terminal 70-1 and the main terminal 70-4.

The load 160 is connected to the main terminals 70-2 and 70-3. An output current from the output element 40 is output to the load 160 via the main terminals 70-2 and 70-3 (i.e., output terminals).

The controller 180 is configured to control the output element 40. In the present example, the controller 180 is connected to the gate terminals 50-1 and 50-2 and the sense terminals 60-1, 60-2, and 60-3. The controller 180 may control the output element 40 by controlling a gate voltage to be applied to the gate terminals 50-1 and 50-2. The controller 180 may control the output element 40 by measuring a sense current from the sense terminal 60. For example, the controller 180 is configured to cut off the gate voltage from being applied, when a measured value of the sense current is an abnormal value. That is, the controller 180 is configured to output a cut-off signal for cutting off the output element 40, when the measured value of the sense current is the abnormal value. The controller 180 may measure the sense current from any one of the sense terminals 60-1, 60-2, and 60-3, or measure sense currents from all of the sense terminals 60-1, 60-2, and 60-3.

As shown in FIG. 3, if a short-circuit is generated in the load 160 that is connected to the main terminals 70-2 and 70-3 (i.e., output terminals), a current that flows into the output element 40 is rapidly increased. If the current that flows into the output element 40 is increased by three times of a rated current of the output element 40 or more, the current that flows into the output element 40 is saturated. In that case, a voltage applied to the output element 40 is increased, and short-circuit energy is generated in the output element 40. Therefore, if the short-circuit is generated in the load 160, the output element 40 experiences a destructive failure because of the short-circuit energy unless current that flows in the output element 40 is cut-off. In particular, if the output element 40 is a SiCMOSFET, because of its low short-circuit withstand capability, the output element 40 is likely to experience a destructive failure.

A period of time until the current that flows in the output element 40 is saturated is affected by an inductance of an output wire connected to an output terminal. If the inductance of the output wire connected to the output terminal is dozens of nH or less, not enough time can be obtained from detecting a short-circuit in the load 160 to cutting off a gate voltage to be applied.

In the present example, the inductor 84 having inductance of 1 µH or more is provided between the connection point C1 and the output terminal (i.e., the main terminals 70-2 and 70-3). By virtue of providing the output wire connected to the output terminal with the inductance of 1 µH or more, a rapid increase in current can be prevented, and more time can be obtained before current is saturated. Therefore, enough time can be obtained for the controller 180 to output the cut-off signal for cutting off the output element 40, and thereby a destructive failure of the output element 40 can be prevented.

If the load 160 is short-circuited, the controller 180 is configured to detect the short-circuit and output the cut-off signal for cutting off the output element 40 before the output element 40 has a saturation current. Detecting the short-circuit by the controller 180 may mean that detecting an abnormal value in a measured value of the sense current from the sense terminal 60, for example. Detecting the abnormal value in the measured value of the sense current may mean that detecting if the sense current is at the rated current of the output element 40. Outputting the cut-off signal for cutting off the output element 40 may mean that cutting off a gate voltage to be applied to the output element 40.

The inductance of the inductor 84 may be one-tenth of an inductance of the load 160, or less. By making the inductor 84 have the inductance of one-tenth of the inductance of the load 160 or less, influence from the inductor 84 can be minimized while no short-circuit is generated. The inductance of the inductor 84 may be one-hundredth of the inductance of the load 160, or less. The inductance of the inductor 84 may be one-thousandth of the inductance of the load 160, or less. The inductance of the load 160 is 10 µH or more, by way of example.

Figure 4:
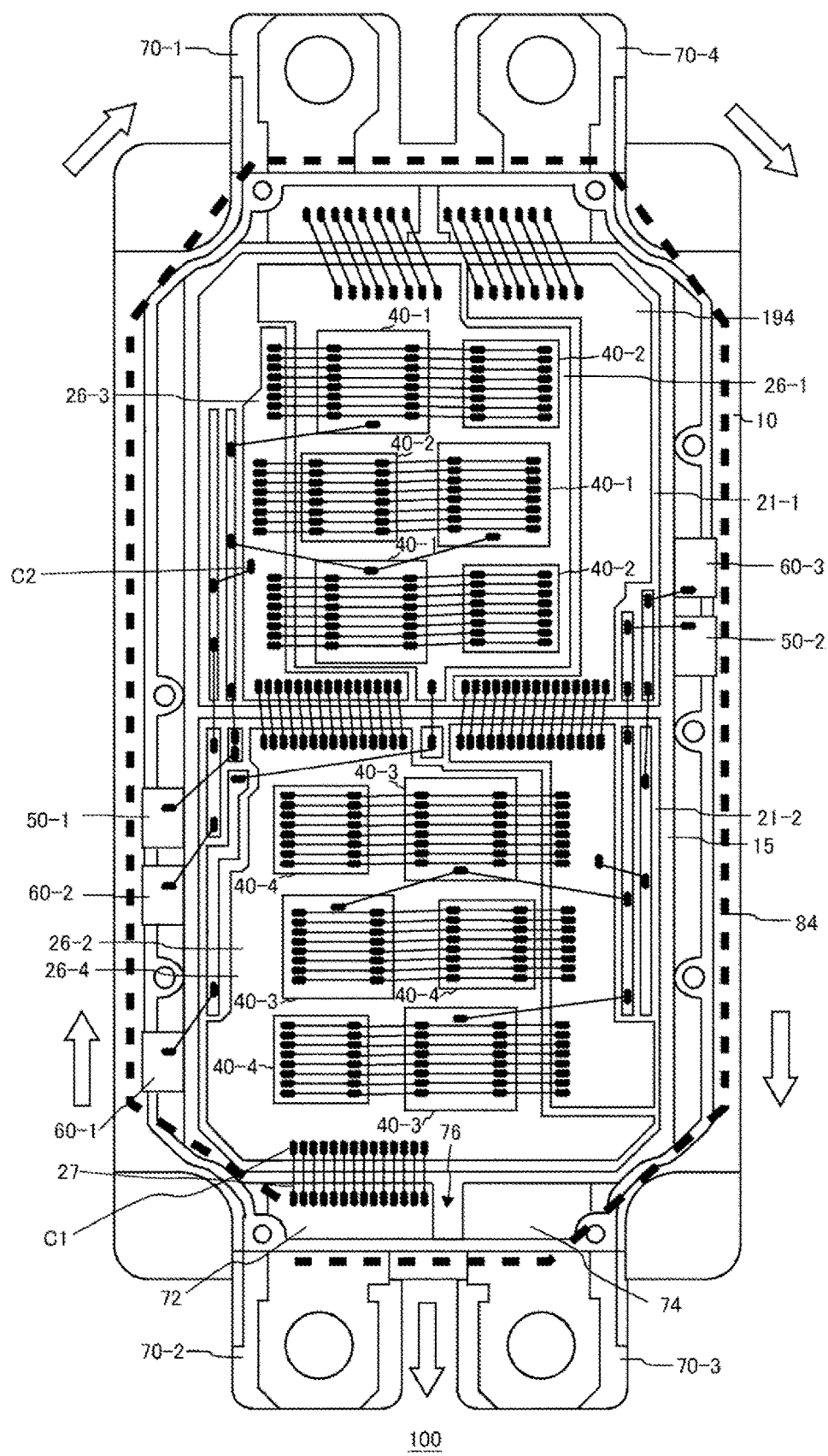
FIG. 4 illustrates one example of an arrangement of an inductor 84 in the semiconductor module 100.

FIG. 4 illustrates one example of an arrangement of the inductor 84 in the semiconductor module 100. In FIG. 4, the inductor 84 is shown with a dotted line. Also, a direction of a current to flow from the connecting portion 72 to the output terminal is shown with arrows. In the present example, the inductor 84 is connected to the connecting portion 72. In addition, the inductor 84 is connected to at least one of the output terminal or the connecting portion 74. The inductor 84 is arranged so as to encircle a circuit including the output element 40, as seen in a top view. A number of times for the inductor 84 to encircle the circuit including the output element 40 is referred to as a number of windings of a wiring line of the inductor 84. As seen in a top view, the resin case 10 has four sides that surround the circuit including the output element 40. One encircling may be counted when the inductor 84 is wound around from a start point on any side to an end point on this side via other three sides. The start point and the end point may be apart from each other on this side. The number of windings of the wiring line of the inductor 84 may be at least one or more. In FIG. 4, the number of windings of the wiring line of the inductor 84 is one. In order to increase an inductance of the inductor 84, it is preferable that the number of windings of the wiring line of the inductor 84 is at least one or more.

In FIG. 4, a circuit pattern 26-3 is a circuit pattern 26 in the circuit pattern 26-1, which is connected to the main electrodes of the output elements 40-1 and 40-2 with the wire 27. Also, a circuit pattern 26-4 is a circuit pattern 26 in the circuit pattern 26-2, which is connected to the back-surface electrodes of the output elements 40-3 and 40-4. In FIG. 4, the circuit patterns 26-3 and 26-4, and the connecting portion 72 are examples of the arm-to-arm wiring line 62 illustrated in FIG. 2. At least a part of the arm-to-arm wiring line 62 may form the circuit pattern 26. At least a part of the arm-to-arm wiring line 62 may form the connecting portion 72. The connection point C1 may be a point having an electric potential equal to those of the main electrodes of the output elements 40-1 and 40-2. The connection point C1 may be a point having an electric potential equal to those of the back-surface electrodes of the output elements 40-3 and 40-4. In FIG. 4, the connection point C1 is provided on the circuit pattern 26-4, and is a connection point on the wire 27 connected to the connecting portion 72.

The connection point C2 may be a point having an electric potential equal to those of the main electrodes of the output elements 40-1 and 40-2. The connection point C2 may be a point having an electric potential equal to those of the back-surface electrodes of the output elements 40-3 and 40-4. In FIG. 4, the connection point C2 is provided on the circuit pattern 26-3, and is a connection point on the wire 27 electrically connected to the sense terminal 60-2.

The wiring line of the inductor 84 may be a band-form conductor. The wiring line of the inductor 84 is formed of copper, aluminum, copper alloy, or aluminum alloy, by way of example. The wiring line of the inductor 84 may have a width of from 1.0 mm to 10.0 mm in a Z axis direction. The inductor 84 may have a thickness of from 0.1 mm to 1.0 mm in a thickness direction of a side wall of the resin case 10 (i.e., a direction perpendicular to an extending direction of the inductor 84). With such a configuration, electrical resistance can be reduced in an output current while increasing the inductance of the inductor 84. The inductor 84 may have a length of from 100 mm to 1500 mm. With such a length, the electrical resistance can be reduced in the output current while providing a predefined inductance.

In FIG. 4, the wiring line of the inductor 84 is provided surrounding the accommodation space 194, as seen in a top view. In order to surround the accommodation space 194, the wiring line of the inductor 84 is provided along the side wall of the resin case 10. In the present example, the wiring line of the inductor 84 is provided inside the resin case 10. That is, the wiring line of the inductor 84 is embedded in a resin part of the resin case 10. A part of the wiring line of the inductor 84 may be exposed from the resin case 10. Since the wiring line of the inductor 84 is provided in the resin case 10, the semiconductor module 100 can be prevented from being oversized.

FIG. 5 illustrates one example of a schematic view of the connecting portion 72 of the semiconductor module 100. In FIG. 5, a cross section X-Z of the semiconductor module 100 is illustrated. In the cross section, the semiconductor module 100 includes the resin case 10, the encapsulation resin 12, the base plate 15, the insulating substrate 21, the circuit pattern 26, the wire 27, the output element 40, the main terminal 70-2, the connecting portion 72, and the inductor 84. In the cross section, the main terminal 70-2 and the inductor 84 are directly connected.

In the cross section, the wiring line of the inductor 84 is provided farther outward inside the resin case 10 than the connecting portion 72. With such a configuration, the wiring line of the inductor 84 can be provided inside the resin case 10, and thereby the semiconductor module 100 can be prevented from being oversized.

FIG. 6 illustrates one example of a schematic view of the connecting portion 74 of the semiconductor module 100. In FIG. 6, a cross section X-Z of the semiconductor module 100 is illustrated. In the cross section, the semiconductor module 100 includes the resin case 10, the encapsulation resin 12, the base plate 15, the insulating substrate 21, the circuit pattern 26, the output element 40, the main terminal 70-3, the connecting portion 74, and the inductor 84. In the cross section, the main terminal 70-3, the connecting portion 74, and the inductor 84 are directly connected.

Similar to FIG. 5, the wiring line of the inductor 84 is provided farther outward in the resin case 10 than the connecting portion 74 in the cross section. With such a configuration, the wiring line of the inductor 84 can be provided inside the resin case 10, and thereby the semiconductor module 100 can be prevented from being oversized.

Figure 7:
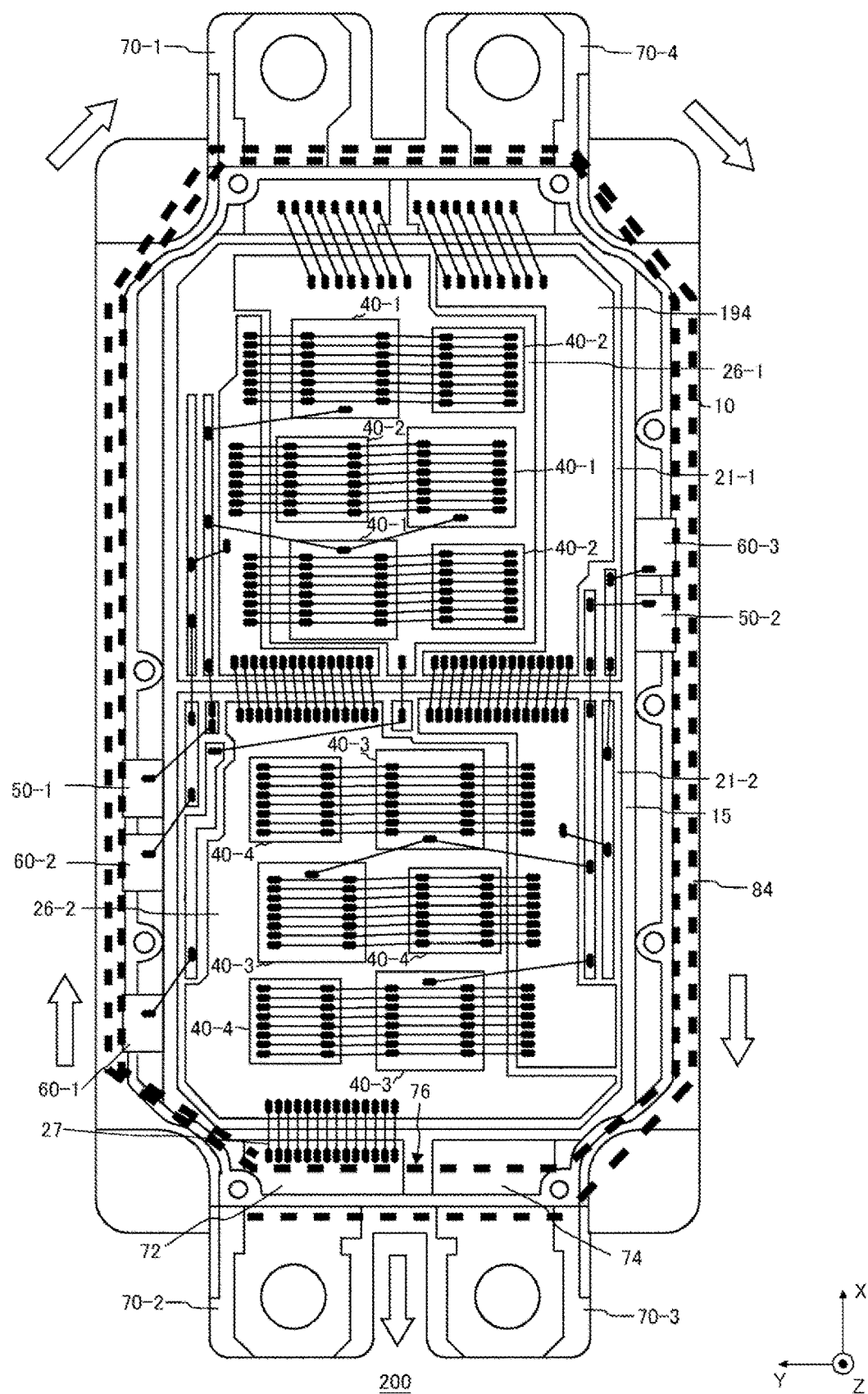
FIG. 7 illustrates one example of an arrangement of an inductor 84 in a semiconductor module 200.

FIG. 7 illustrates one example of an arrangement of an inductor 84 in a semiconductor module 200. In view of a configuration of the inductor 84, the semiconductor module 200 illustrated in FIG. 7 is different from the semiconductor module 100 illustrated in FIG. 4. Other than that, the semiconductor module 200 may have a same configuration as that of the semiconductor module 100.

In FIG. 7, a number of windings of a wiring line of the inductor 84 is two. An inductance of the inductor 84 can be increased by increasing the number of windings of the wiring line of the inductor 84, and thus a destructive failure in an output element 40 can be prevented. The number of windings of the wiring line of the inductor 84 can be three or more. The number of windings of the wiring line of the inductor 84 is preferably a number that allows the wiring line to be inside the resin case 10. The inductor 84 may be concentrically arranged as seen in a top view.

Figure 8:
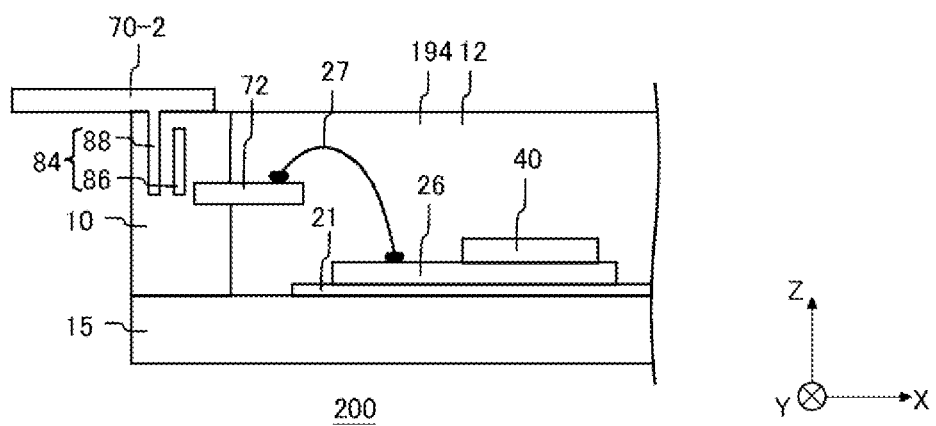
FIG. 8 illustrates one example of a schematic view of a connecting portion 72 of the semiconductor module 200.

FIG. 8 illustrates one example of a schematic view of a connecting portion 72 of the semiconductor module 200. In FIG. 8, a cross section X-Z of the semiconductor module 200 is illustrated. In the cross section, the semiconductor module 200 includes the resin case 10, an encapsulation resin 12, a base plate 15, an insulating substrate 21, a circuit pattern 26, a wire 27, the output element 40, a main terminal 70-2, the connecting portion 72, and the inductor 84. The inductor 84 has a first portion 86 and a second portion 88 in the cross section. In the inductor 84, the first portion 86 is arranged farther inward than the second portion 88. In the cross section, the main terminal 70-2 and the second portion 88 are directly connected.

In the cross section, the wiring line of the inductor 84 is provided farther outward in the resin case 10 than the connecting portion 72. In the present example, both of the first portion 86 and the second portion 88 are provided farther outward in the resin case 10 than the connecting portion 72. With such a configuration, the wiring line of the inductor 84 can be provided inside the resin case 10, and thereby the semiconductor module 200 can be prevented from being oversized. In addition, in order to prevent the semiconductor module 200 from being oversized, it is preferable to provide at least a part of the first portion 86, the second portion 88, and the connecting portion 72 within a same range in a Z axis direction.

Figure 9:
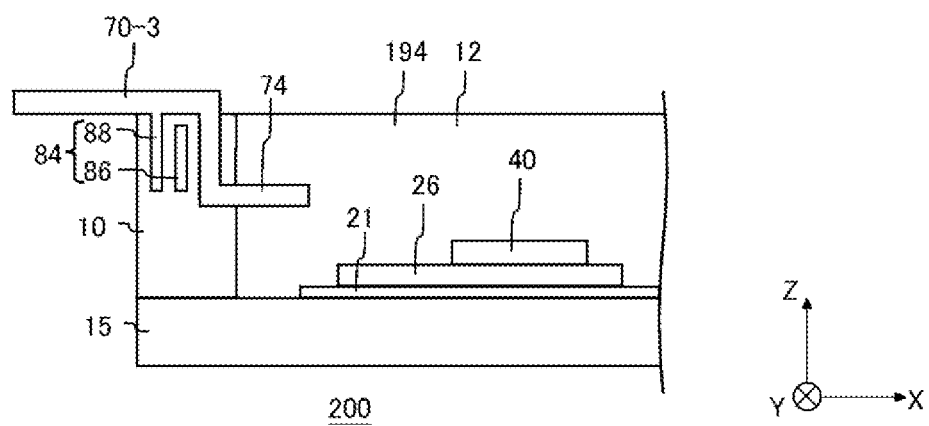
FIG. 9 illustrates one example of a schematic view of a connecting portion 74 of the semiconductor module 200.

FIG. 9 illustrates one example of a schematic view of a connecting portion 74 of the semiconductor module 200. In FIG. 9, a cross section X-Z of the semiconductor module 200 is illustrated. In the cross section, the semiconductor module 200 includes the resin case 10, the encapsulation resin 12, the base plate 15, the insulating substrate 21, the circuit pattern 26, the output element 40, a main terminal 70-3, the connecting portion 74, and the inductor 84. The inductor 84 has a first portion 86 and a second portion 88 in the cross section. In the cross section, the main terminal 70-3, the connecting portion 74, and the second portion 88 are directly connected.

Similar to FIG. 8, the wiring line of the inductor 84 is provided farther outward in the resin case 10 than the connecting portion 74 in the cross section. In the present example, both of the first portion 86 and the second portion 88 are provided farther outward in the resin case 10 than the connecting portion 74. With such a configuration, the wiring line of the inductor 84 can be provided inside the resin case 10, and thereby the semiconductor module 200 can be prevented from being oversized. In addition, in order to prevent the semiconductor module 200 from being oversized, it is preferable to provide at least a part of the first portion 86, the second portion 88, and the connecting portion 74 within a same range in a Z axis direction.

Figure 10:
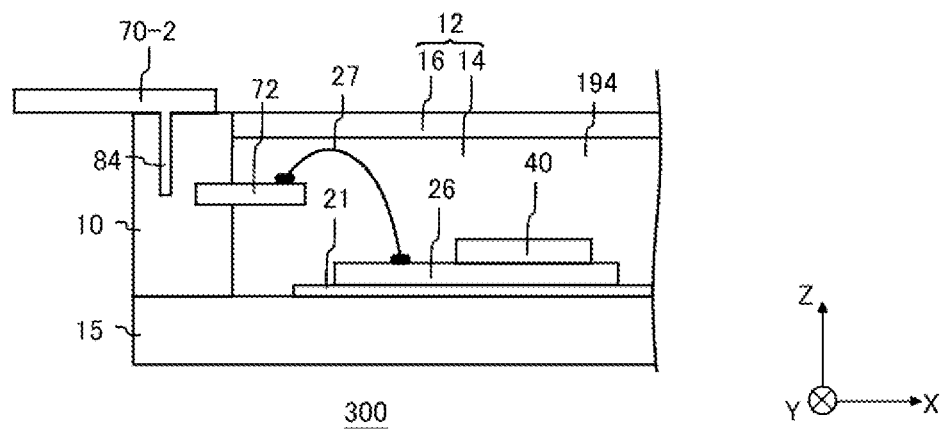
FIG. 10 illustrates one example of a schematic view of a connecting portion 72 of a semiconductor module 300.

FIG. 10 illustrates one example of a schematic view of a connecting portion 72 of the semiconductor module 300. In view of a configuration of an encapsulation resin 12, the semiconductor module 300 illustrated in FIG. 10 is different from the semiconductor module 100 illustrated in FIG. 5. Other than that, the semiconductor module 300 may have a same configuration as that of the semiconductor module 100.

The encapsulation resin 12 may contain silicon gel, and material having permeability higher than that of silicon gel. In the present example, the encapsulation resin 12 includes a silicon gel layer 14 and a high permeability layer 16. The silicon gel layer 14 may contain silicon gel. The high permeability layer 16 may be provided on the silicon gel layer 14. The high permeability layer 16 may contain material having permeability higher than that of the silicon gel layer 14. The high permeability layer 16 contains a soft magnetic material, a metal material such as iron, an oxide material such as ferrite, and the like. The high permeability layer 16 may contain silicon gel. The silicon gel layer 14 may not contain a soft magnetic material. Since the encapsulation resin 12 has the high permeability layer 16, an inductance of an inductor 84 can be increased further.

It is preferable that the high permeability layer 16 is not in direct contact with a circuit pattern 26, a wire 27, an output element 40, and the like. This is because if the high permeability layer 16 contains the metal material etc., the circuit pattern 26, the wire 27, the output element 40, and the like may be affected by the metal material etc.

In the present example, the encapsulation resin 12 is shown as being provided with the silicon gel layer 14 and the high permeability layer 16, whereas the encapsulation resin 12 is not limited to be provided with two layers like this example. The encapsulation resin 12 can only have one layer and contain silicon gel and material having permeability higher than that of silicon gel. In other words, this one layer can contain the silicon gel and the material having permeability higher than that of the silicon gel. The encapsulation resin 12 can be provided with three or more layers.

Figure 11:
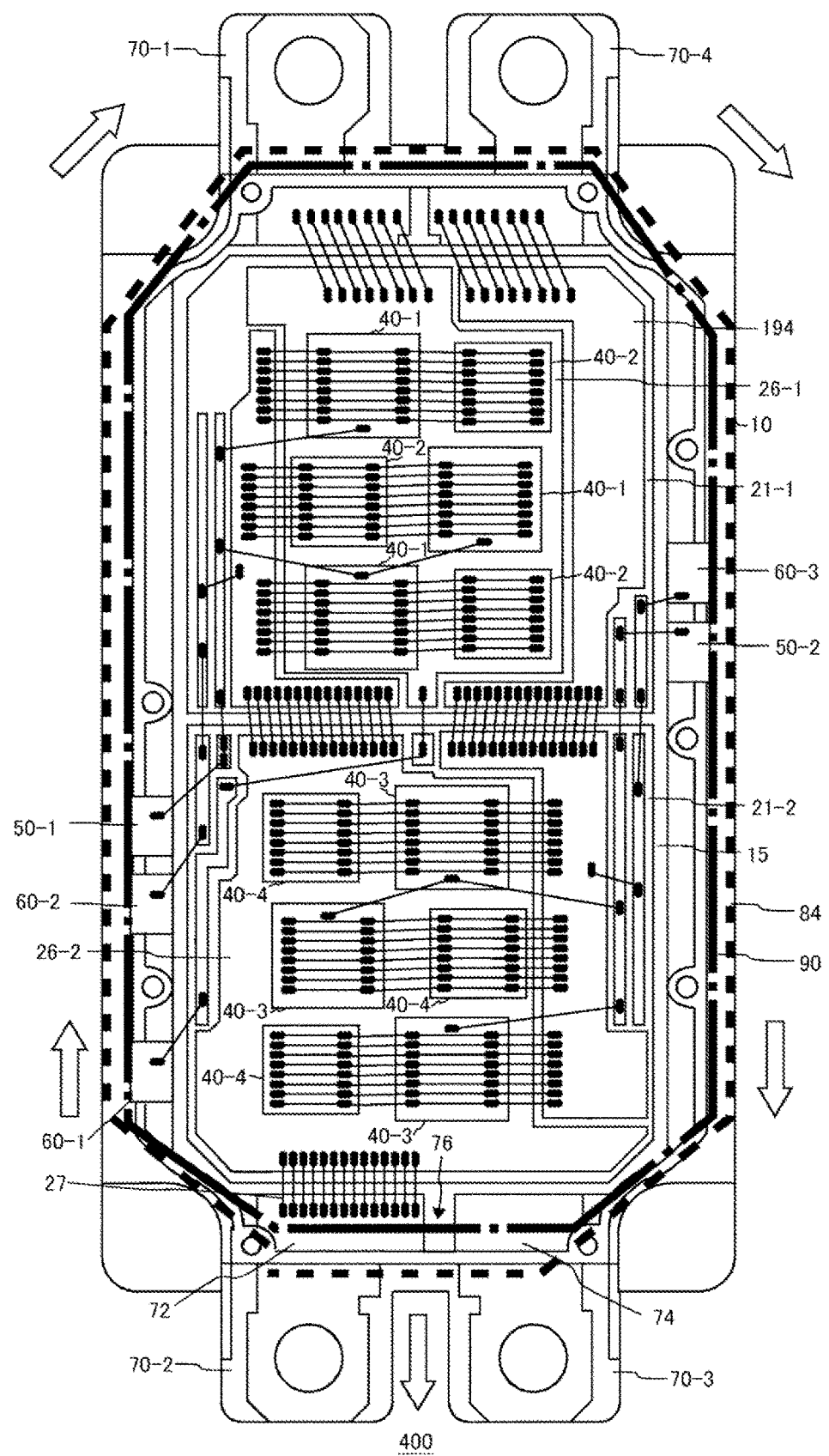
FIG. 11 illustrates one example of arrangements of an inductor 84 and a material 90 in a semiconductor module 400.

FIG. 11 illustrates one example of arrangements of an inductor 84 and a material 90 in a semiconductor module 400. The semiconductor module 400 illustrated in FIG. 11 is different from the semiconductor module 100 illustrated in FIG. 5 in that the semiconductor module 400 includes the material 90. Other than that, the semiconductor module 400 may have a same configuration as that of the semiconductor module 100. In FIG. 11, the material 90 is shown with a dot-dash line.

In the present example, the semiconductor module 400 includes the material 90. The material 90 may have permeability higher than that of an encapsulation resin 12. The material 90 has permeability higher than that of silicon gel, for example. The material 90 is a metal material such as iron, by way of example. The material 90 is provided inside a resin case 10. Further, the material 90 is preferably provided farther inward in the semiconductor module 400 than the inductor 84. An inductance of the inductor 84 can be increased further by providing the material 90, which has permeability higher than that of silicon gel, farther inward in the semiconductor module 400 than the inductor 84. The material 90 may be provided in a ring-shape as seen in a top view.

Figure 12:
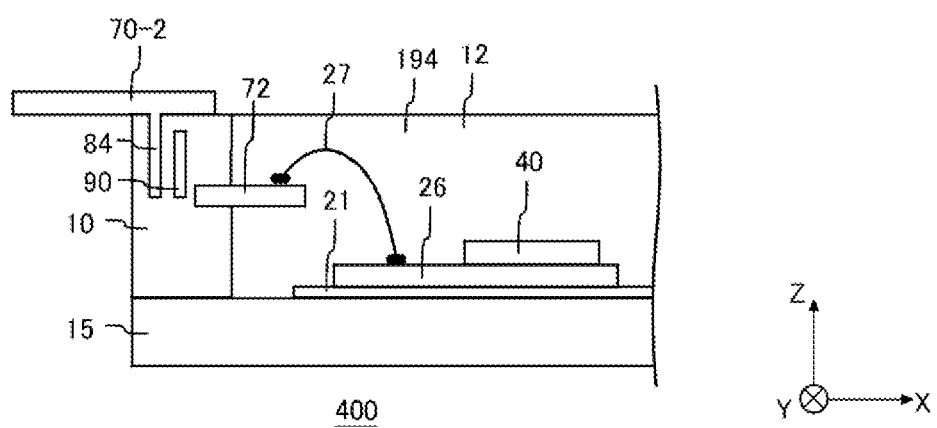
FIG. 12 illustrates one example of a schematic view of a connecting portion 72 of the semiconductor module 400.

FIG. 12 illustrates one example of a schematic view of a connecting portion 72 of the semiconductor module 400. In FIG. 12, a cross section X-Z of the semiconductor module 400 is illustrated. In the cross section, the semiconductor module 400 includes the resin case 10, the encapsulation resin 12, a base plate 15, an insulating substrate 21, a circuit pattern 26, a wire 27, an output element 40, a main terminal 70-2, the connecting portion 72, the inductor 84, and the material 90. In the cross section, the main terminal 70-2 and the inductor 84 are directly connected.

In the cross section, a wiring line of the inductor 84 and the material 90 are provided farther outward in the resin case 10 than the connecting portion 72. With such a configuration, the wiring line of the inductor 84 and the material 90 can be provided inside the resin case 10, and thereby the semiconductor module 400 can be prevented from being oversized. In addition, because the wiring line of the inductor 84 and the material 90 increase an inductance of the inductor 84, they are preferably provided within a same range in a Z axis direction. In order to further increase the inductance of the inductor 84, the encapsulation resin 12 may include a high permeability layer 16 as shown in FIG. 10.

Figure 13:
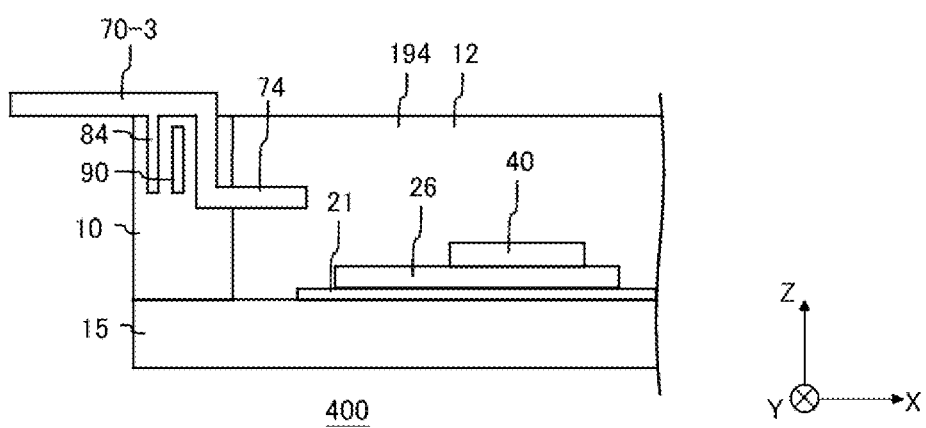
FIG. 13 illustrates one example of a schematic view of a connecting portion 74 of the semiconductor module 400.

FIG. 13 illustrates one example of a schematic view of a connecting portion 74 of the semiconductor module 400. In FIG. 13, a cross section X-Z of the semiconductor module 400 is illustrated. In the cross section, the semiconductor module 400 includes the resin case 10, the encapsulation resin 12, the base plate 15, the insulating substrate 21, the circuit pattern 26, the output element 40, a main terminal 70-3, the connecting portion 74, the inductor 84, and the material 90. In the cross section, the main terminal 70-3, the connecting portion 74, and the inductor 84 are directly connected.

Similar to FIG. 12, in the cross section, the wiring line of the inductor 84 and the material 90 are provided farther outward in the resin case 10 than the connecting portion 74. With such a configuration, the wiring line of the inductor 84 and the material 90 can be provided inside the resin case 10, and thereby the semiconductor module 400 can be prevented from being oversized. In addition, because the wiring line of the inductor 84 and the material 90 increase an inductance of the inductor 84, they are preferably provided within a same range in a Z axis direction.

Figure 14:
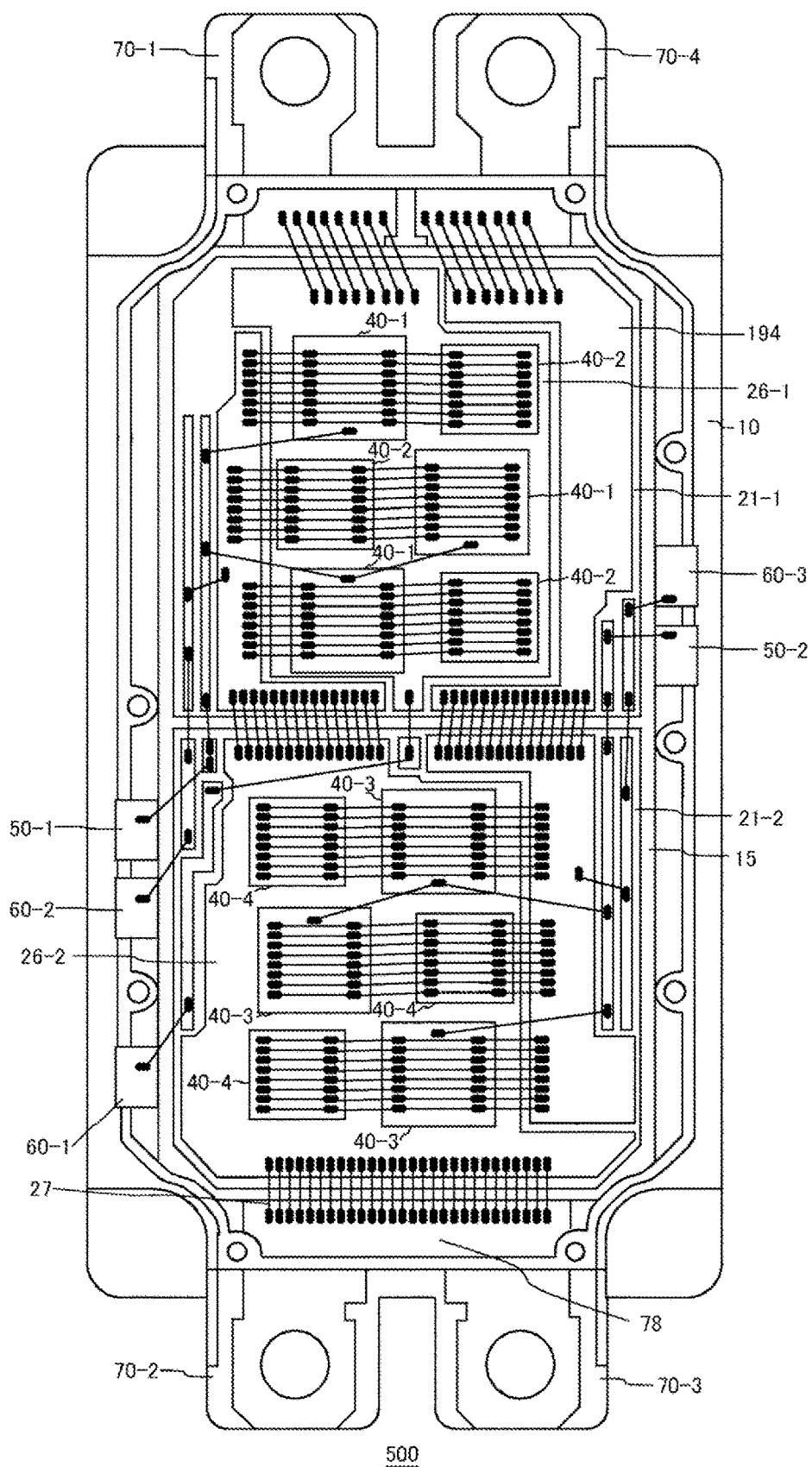
FIG. 14 illustrates one example of a semiconductor module 500 according to a comparative example.

FIG. 14 illustrates one example of a semiconductor module 500 according to a comparative example. The semiconductor module 500 illustrated in FIG. 14 is different from the semiconductor module 100 illustrated in FIG. 1 in that the semiconductor module 500 includes no inductor 84. Other than that, the semiconductor module 500 may have a same configuration as that of the semiconductor module 100.

In the present example, the semiconductor module 500 includes a connecting portion 78 instead of a connecting portion 72 and a connecting portion 74. The connecting portion 78 is connected to a circuit pattern 26 through a wire 27. The connecting portion 78 is connected to a main terminal 70-2 and a main terminal 70-3.

Figure 15:
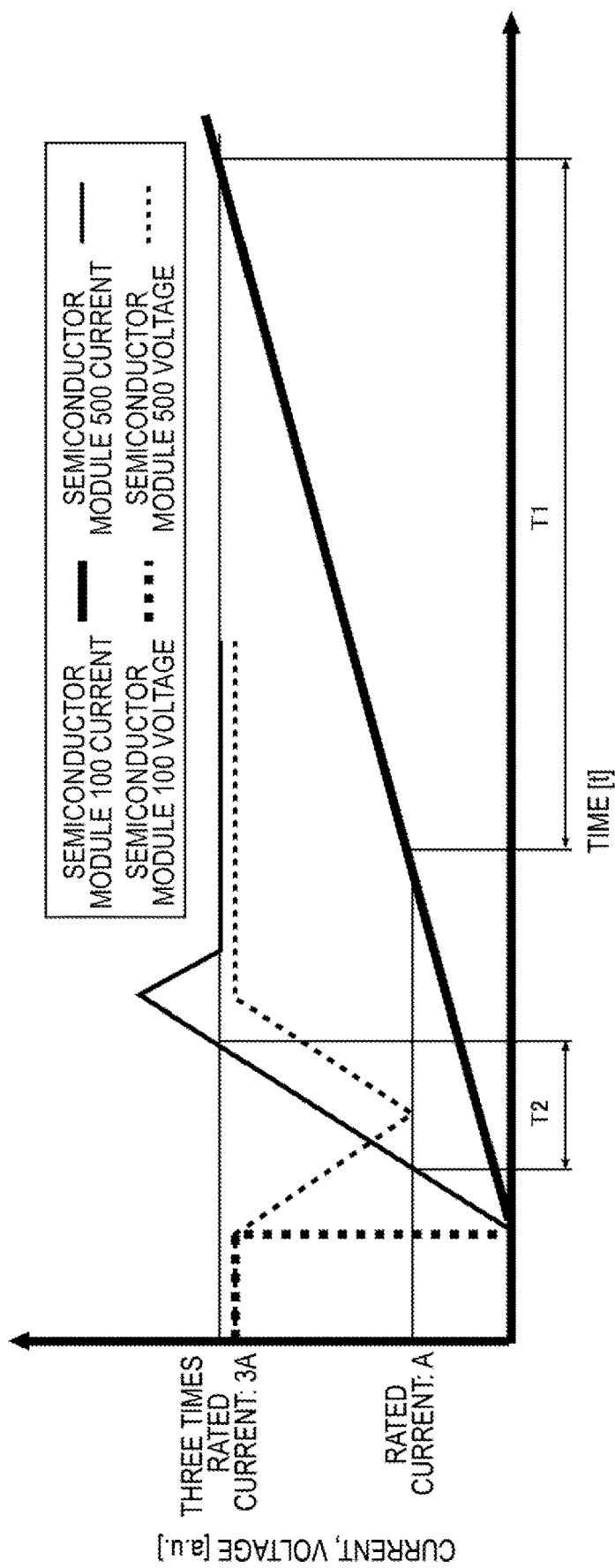
FIG. 15 illustrates changes in current and voltage of output elements 40 of the semiconductor modules 100 and 500 when loads 160 are short-circuited.

FIG. 15 illustrates changes in current and voltage of the output elements 40 of the semiconductor modules 100 and 500 when the loads 160 are short-circuited. In FIG. 15, a bold line shows the change in the current of the output element 40 of the semiconductor module 100. In FIG. 15, a thick dotted line shows the change in the voltage of the output element 40 of the semiconductor module 100. In FIG. 15, a thin line shows the change in the current of the output element 40 of the semiconductor module 500. In FIG. 15, a thin dotted line shows the change in the voltage of the output element 40 of the semiconductor module 500. Note that, the changes in the current and voltage in the output element 40 of each semiconductor module may be measured by the sense terminals 60-1, 60-2, and 60-3, or may be measured by any one of the sense terminals 60.

In the semiconductor module 500 of the comparative example, when a short-circuit is generated on a side of the load 160, a voltage applied to the output element 40 becomes almost zero, instantaneously. Accompanying to that, current that flows in the output element 40 is rapidly increased. In the semiconductor module 500 of the comparative example, since there is no inductor 84 provided, current enters into a saturation region instantaneously. When the current enters into the saturation region, voltage between the power supply 140 and a ground is applied, and thus the voltage is increased rapidly. As a result, an amount of energy becomes very high due to high voltage and current keep being applied, and the output element 40 may experience a destructive failure after detecting the current increase but before cutting off a gate voltage to be applied to the output element 40.

Similarly, in the semiconductor module 100, when a short-circuit is generated on a side of the load 160, a voltage applied to the output element 40 becomes almost zero, instantaneously. Accompanying to that, current that flows in the output element 40 is increased, but since the semiconductor module 100 is provided with the inductor 84, it takes time until the current enters into a saturation region. Also, voltage is increased by only a small amount before the current enters into the saturation region. The current increase is detected before the current enters into the saturation region, and then a gate voltage to be applied to the output element 40 is cut-off. Therefore, with a small amount of energy, the output element 40 will not experience a problem of the destructive failure.

In the present example, a rated current A of the output element 40 is shown as a detection current with a current value at a beginning of a detection, and 3 A being a current three times as much as the rated current is shown as a saturation current. In the semiconductor module 100, T1 is a period of time for the detection current to reach the saturation current. In the semiconductor module 500, T2 is a period of time for the detection current to reach the saturation current. Since the semiconductor module 100 includes the inductor 84 having an inductance of 1 μH or more, a rapid increase in current can be prevented, and thus the time T1 can be greater than the time T2.

The time T1 is preferably 10 μs or more. With the time T1 being 10 μs or more, there can be enough time from the detecting to the cutting off. A gradient of the change in the output current may be $di/dt<(3A-A)/10 \mu s=2 A\times10^5$ A/s. When the rated current A is 30 A, the gradient of the change in the output current can be $di/dt<6\times10^6$ A/s for the time T1 to be 10 μs or more. The greater a value of the time T1 is, the more preferable it is.

While the present invention have been described with the embodiments, the technical scope of the present invention is not limited to the above described embodiments. It is apparent to persons skilled in the art that various alterations and improvements can be added to the above-described embodiments. It is also apparent from the description of the claims that embodiments added with such alterations or improvements can be included in the technical scope of the present invention.

EXPLANATION OF REFERENCES

10: resin case;
12: encapsulation resin;
14: silicon gel layer;
15: base plate;
16: high permeability layer;
21: insulating substrate;
26: circuit pattern;
27: wire;
40: output element;
50: gate terminal;
60: sense terminal;
62: arm-to-arm wiring line;
70: main terminal;
72: connecting portion;
74: connecting portion;
76: gap;
78: connecting portion;
84: inductor;
86: first portion;
88: second portion;
90: material;
100: semiconductor module;
140: power supply;
160: load;
180: controller;
194: accommodation space;
200: semiconductor module;
300: semiconductor module;
400: semiconductor module;
500: semiconductor module.

What is claimed is:

1. A semiconductor module, comprising:
a plurality of output elements provided to constitute an upper arm and a lower arm;
a resin case provided surrounding an accommodation space for accommodating the output elements;
an arm-to-arm wiring line for connecting the upper arm with the lower arm;
an output terminal, which is connected to the arm-to-arm wiring line and is for outputting output currents from the output elements to a load being external to the semiconductor module;
a sense terminal, which is connected to the arm-to-arm wiring line and is for detecting currents that flow in the output elements; and
an inductor provided between a connection point for connecting the arm-to-arm wiring line with the output terminal, and the output terminal, wherein
an inductance of the inductor is 1 µH or more.

2. The semiconductor module according to claim 1, wherein the inductance of the inductor is one-tenth of an inductance of the load, or less.

3. The semiconductor module according to claim 1, wherein the inductor is not provided between a connection point for connecting the arm-to-arm wiring line with the sense terminal, and the sense terminal.

4. The semiconductor module according to claim 1, wherein
the output elements are controlled by a controller provided externally, and
the controller is configured to, when the load is short-circuited, detect the short-circuit, and output a cut-off signal for cutting off the output elements before the output elements have saturation currents.

5. The semiconductor module according to claim 1, wherein if rated currents of the output elements are A, a gradient di/dt of a change in an output current when the load is short-circuited is di/dt<2 A×105 A/s.

6. The semiconductor module according to claim 1, wherein a wiring line of the inductor is provided surrounding the accommodation space, as seen in a top view.

7. The semiconductor module according to claim 1, wherein
the resin case has four side walls surrounding a circuit that includes the output elements, and
a wiring line of the inductor is wound around from a start point on a first side wall among the four side walls to an end point on the first side wall via other three side walls of the four side walls.

8. The semiconductor module according to claim 1, wherein a wiring line of the inductor is embedded in a resin part of the resin case.

9. The semiconductor module according to claim 8, further comprising
a connecting portion, which is provided in the resin case and the accommodation space, and is electrically connected to the output terminal, wherein
the wiring line of the inductor is provided farther outward in the resin case than the connecting portion.

10. The semiconductor module according to claim 8, wherein a number of at least one windings of the wiring line of the inductor is at least one or more.

11. The semiconductor module according to claim 1, further comprising
an encapsulation resin for encapsulating the output elements, wherein the encapsulation resin contains:
silicon gel; and
material having permeability higher than permeability of the silicon gel.

12. The semiconductor module according to claim 11, wherein
the encapsulation resin has:
a silicon gel layer including the silicon gel; and
a high permeability layer, which is provided on the silicon gel layer, and includes the material having permeability higher than permeability of the silicon gel.

13. The semiconductor module according to claim 1, wherein the resin case is provided therein with material having permeability higher than permeability of silicon gel.

14. The semiconductor module according to claim 1, wherein the output elements are SiCMOSFETs.

15. The semiconductor module according to claim 1, wherein
at least a part of the arm-to-arm wiring line forms a circuit pattern being a wiring pattern on which the output elements are arranged, and
the connection point for connecting the arm-to-arm wiring line with the output terminal is provided on the circuit pattern.

16. The semiconductor module according to claim 2, wherein the inductor is not provided between a connection point for connecting the arm-to-arm wiring line with the sense terminal, and the sense terminal.

17. The semiconductor module according to claim 2, wherein
- the output elements are controlled by a controller provided externally, and
- the controller is configured to, when the load is short-circuited, detect the short-circuit, and output a cut-off signal for cutting off the output elements before the output elements have saturation currents.

18. The semiconductor module according to claim 3, wherein
- the output elements are controlled by a controller provided externally, and
- the controller is configured to, when the load is short-circuited, detect the short-circuit, and output a cut-off signal for cutting off the output elements before the output elements have saturation currents.

19. The semiconductor module according to claim 2, wherein if rated currents of the output elements are A, a gradient di/dt of a change in an output current when the load is short-circuited is di/dt<2 A×10⁵ A/s.

20. The semiconductor module according to claim 3, wherein if rated currents of the output elements are A, a gradient di/dt of a change in an output current when the load is short-circuited is di/dt<2 A×10⁵ A/s.

\* \* \* \* \*